United States Patent [19]

Watson

[11] Patent Number: 5,041,191

[45] Date of Patent: Aug. 20, 1991

[54] DIFFUSION BARRIER FOR THIN FILM HYBRID CIRCUITS

[75] Inventor: James C. Watson, Newport Beach, Calif.

[73] Assignee: Rockwell International Corporation, El Segundo, Calif.

[21] Appl. No.: 435,928

[22] Filed: Nov. 13, 1989

[51] Int. Cl.[5] .................... B44C 1/22; C23F 1/02
[52] U.S. Cl. .................................. 156/652; 29/620;
156/656; 156/659.1; 156/664; 156/901;
252/79.5; 338/308; 427/103; 437/190; 437/192
[58] Field of Search .................... 338/308; 252/79.5;
156/652, 656, 659.1, 664, 901, 902; 29/610.1,
620; 427/103; 437/190, 192

[56] References Cited

U.S. PATENT DOCUMENTS

| | | | |
|---|---|---|---|
| 3,649,945 | 3/1972 | Waits | 29/620 X |
| 4,087,314 | 5/1978 | George et al. | 437/190 X |
| 4,495,222 | 1/1985 | Anderson et al. | 437/190 |
| 4,507,851 | 4/1985 | Joyner et al. | 437/190 |
| 4,882,293 | 11/1989 | Neumann et al. | 437/190 X |
| 4,923,827 | 5/1990 | Calviello et al. | 437/190 |

Primary Examiner—William A. Powell
Attorney, Agent, or Firm—H. Fredrick Hamann; George A. Montanye; Wilfred G. Caldwell

[57] ABSTRACT

A thin film resistor and method of making employs tungsten or tungsten titanium alloy as an alectrically conductive diffusion barrier between the nickel chromium resistor and the gold conductor. A solution of cupric sulfate, ammonium hydroxide, glycerol and deionized water is used to remove the unwanted diffusion barrier without damaging the thin film resistor materials, thereby preserving precision resistance values.

6 Claims, 2 Drawing Sheets

DIFFUSION BARRIER FOR THIN FILM HYBRID CIRCUITS

FIELD OF THE INVENTION

This invention relates to the thin film resistor field, and more particularly to maintaining precision resistors of nickel chromium alloy for single or hybrid circuit use.

BACKGROUND OF THE INVENTION

The prior art sometimes places the gold overlaying conductors directly adjacent to the nickel-chromium resistor material. During metal film deposition and subsequent heat treatments to stabilize the resistors, a destructive inter-diffusion takes place between the nickel-chromium (ni-chrome) alloy and the gold conductor. The chromium diffuses into gold at a much more rapid rate than the gold goes into the chromium, creating voids in the resistor film which result in intermittent and ultimately open circuits.

Other prior art methods use nickel as a diffusion barrier layer between the gold conductor and the nickel-chromium alloy resistor. This type barrier serves only to delay the process, but does not act as a corrective measure.

Further, the etching process to open up the resistors presents a control problem since the etching chemicals used to remove the nickel barrier also attack the nickel in the ni-chrome resistor, altering both the established value and the temperature characteristics.

SUMMARY OF THE INVENTION

The present invention uses tungsten or tungsten-titanium alloy, e.g., tungsten - 10% titanium, as an electrically conductive diffusion barrier between the resistor material and the overlaying conductor (usually gold, but may include aluminum or copper), to be used in the fabrication of thin film resistors. Nickel-chromium alloy is the preferred material for the thin film, fabricated by using radio frequency or direct current sputtering techniques or evaporative techniques. An etchant which essentially doesn't attack the ni-chrome alloy after immersion provides a superior method for the manufacture of hybrid circuits. This etching solution comprises:

| cupric sulfate (CUSO4) | 5 grams |
| ammonium hydroxide (NH4OH) | 10 milliliters |
| glycerol | 100 milliliters |
| deionized water | 125 milliliters |

DETAILED DESCRIPTION OF A PREFERRED EMBODIMENT

Figure 1:
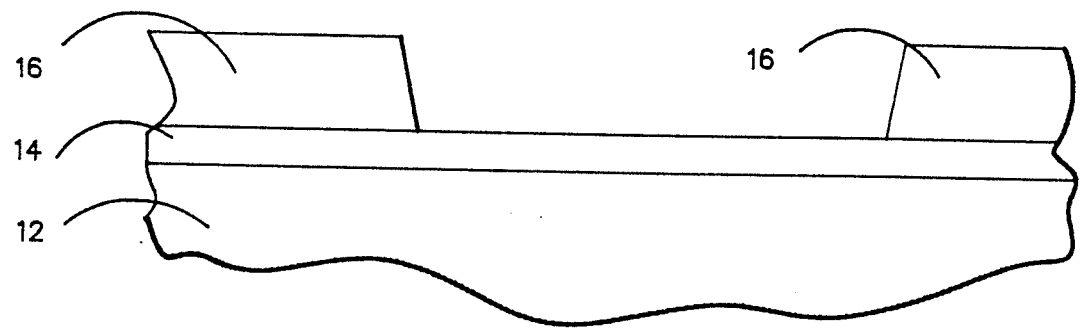
FIG. 1 shows a prior art thin film resistor layer and overlaying conductor layer.

In the prior art structure of FIG. 1, a ceramic or glass support 12 carries a thin film resistor layer 14, in turn overlaid by conductor 16. Here, the destructive inter diffusion takes place between the nickel-chromium alloy (layer 14) and the gold conductor (layer 16). The chromium diffuses into the gold at a much more rapid rate than the gold diffuses into the chromium. Thus, voids in the resistor film result in intermittent and, ultimately in open circuits.

Figure 2:
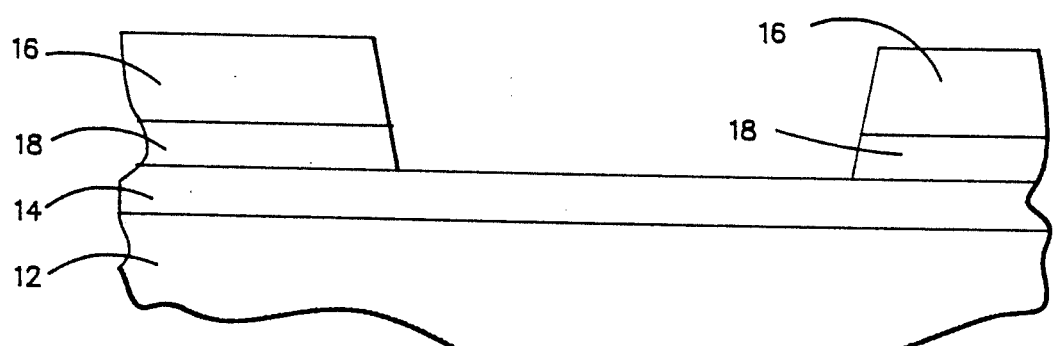
FIG. 2 shows the prior art use of a nickel diffusion barrier added to the structure of FIG. 1.

In FIG. 2, the prior art adds a nickel diffusion barrier 18 between the thin film resistor layer 14 and the gold conductor layer 16. However, nickel, as a diffusion barrier, only delays the gold-chromium diffusion in process, but does not avoid diffusion.

Figure 3:
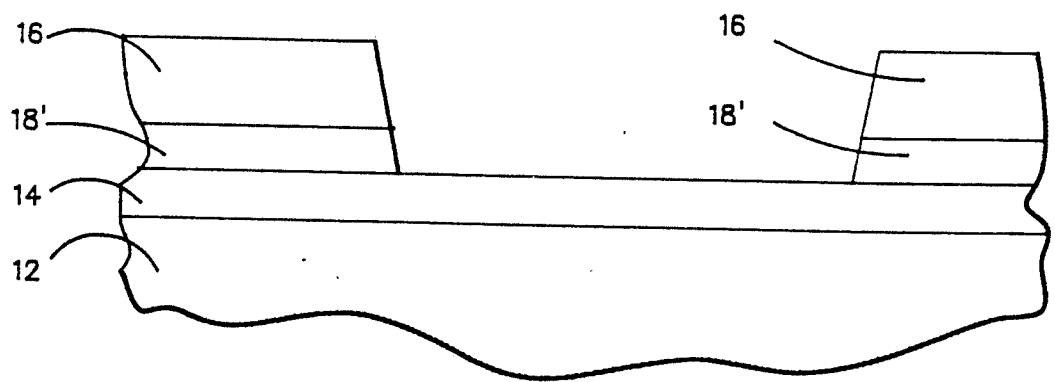
FIG. 3 depicts structure of the present invention incorporating a tungsten or tungsten titanium diffusion barrier in lieu of the nickel barrier; and, FIG. 4 illustrates the use of a thin film resistor of the present invention in a hybrid circuit.

In FIG. 3, a layer 18' of tungsten or tungsten titanium alloy (all of which are highly refractory) has been substituted for the nickel diffusion barrier 18 of the FIG. 2 structure. While this solves the diffusion barrier problem, it is not apparent what type etch will remove tungsten and tungsten titanium alloy without attacking ni-chrome. The below listed etching solution works in the manufacture of discrete resistors and hybrid circuits.

| cupric sulfate (CUSO4) | 5 grams |
| ammonium hydroxide (NH4OH) | 10 milliliters |
| glycerol | 100 milliliters |
| deionized water | 125 milliliters. |

Conventional processing techniques may be used to produce resistor and circuits provided the above materials and solution are employed to achieve applicants objective.

First, the thin film resistor layer 14 of nickel chromium is laid down on support 12 to a depth of the order of 250–300 Å.

The process is performed as follows:
1) After the deposition of all of the layers for the entire circuit, including the resistor regions, is photomasked and, with a series of etchants, is completely delineated down to the support material,
2) the first photomask is then removed and a new mask applied which protects everything but the resistor areas,
3) then the resistor(s) are opened up by removing the gold and the diffusion barrier.

Sputtering or evaporative techniques may be employed to deposit this thin film. Next, a layer 18' of tungsten or tungsten titanium alloy is laid down over the nickel chromium to a thickness of e.g., 1000 Å in convention manner. Last, the conductive layer 16 of gold is laid down to 2000 Å, or more as is customary for forming gold conductors.

This structure is heat treated to a temperature below 300° C. to stabilize the resistor(s). Then, standard photolithography masking and etching techniques are employed to remove the unwanted gold, tungsten or tungsten titanium alloys and nickel chromium film. However, for removal of the tungsten or tungsten titanium alloys the novel etching solution provided herein is employed to open up the resistors.

Figure 4:
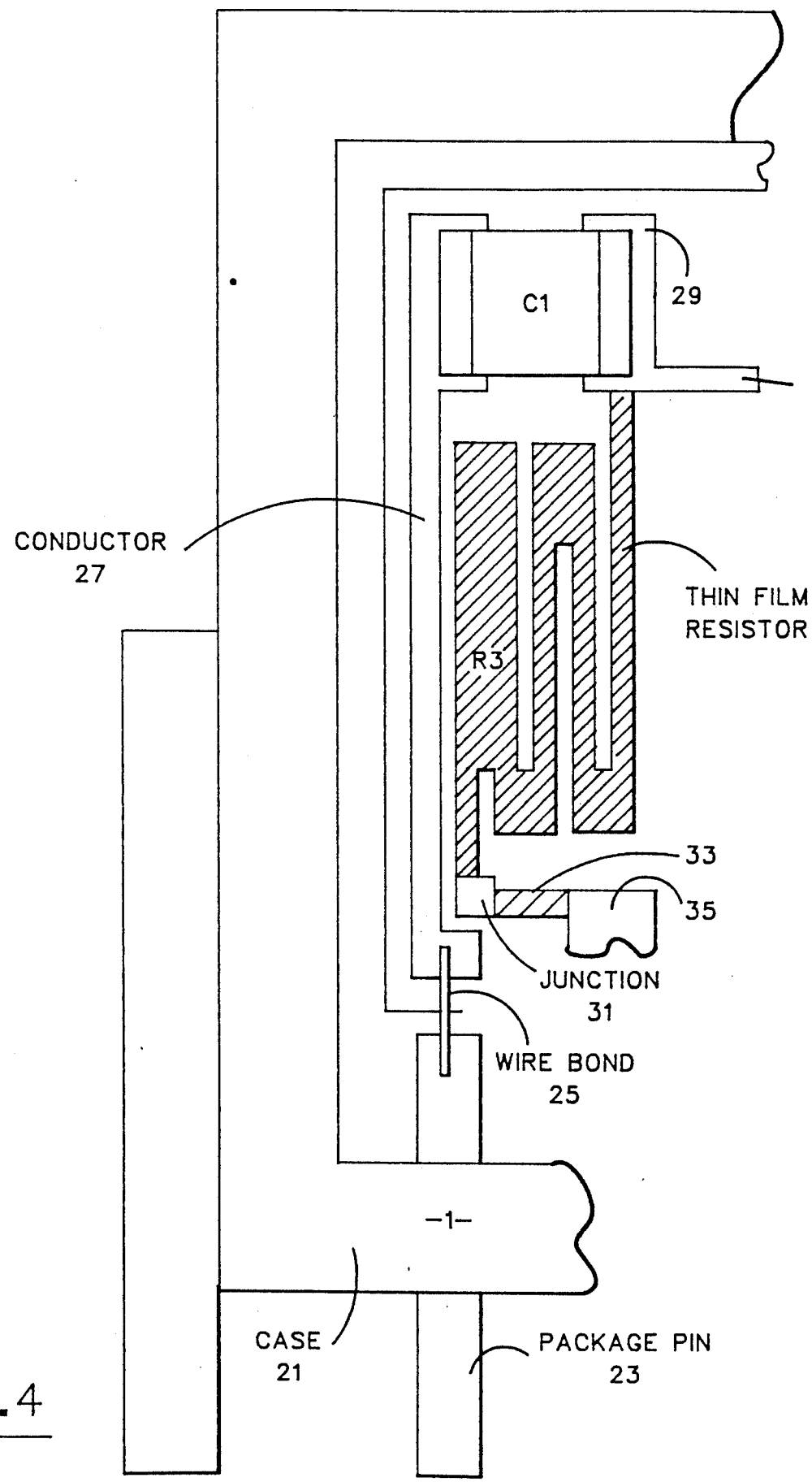

In FIG. 4, a hybrid circuit is shown which also depicts thin film resistor R3. This circuit is contained in case 21 and package pin 23 extends to wire bond 25 which joins gold conductor 27 to pin 23 with the former extending to capacitor C1. The other conductor 29 for capacitor C1 is connected to thin film resistor R3 at one end, with the other end of the resistor R3 being connected via gold junction 31 to gold conductor 33 and the second package pin, partly visible at 35.

In summary, the present invention employs tungsten and its alloys utilizing the high refractory nature of tungsten which therefore provides a high temperature barrier and diffusion rates which are virtually unmeasurable when tungsten or titanium tungsten alloys are employed as a diffusion barrier between the gold conductor and the nickel chromium thin film resistors.

What is claimed is:

1. A method for preventing degradation of thin film nickel chromium alloy resistors owing to voids caused by chromium diffusion into the conductor for the resistor, comprising the steps of:
   establishing a thin film layer of nickel chromium alloy on an insulator surface of a support;
   forming a diffusion barrier comprising at least tungsten overlaying said thin film;
   establishing a conductor layer over said diffusion barrier; and,
   patterning the layers and the thin film to form at least a discrete resistor; and,
   utilizing a solution of:

| cupric sulfate (CUSO$_4$) | 5 grams |
| ammonium hydroxide (NH$_4$OH) | 10 milliliters |
| glycerol | 150 milliliters |
| deionized water | 125 milliliters | to remove the undesired tungsten without appreciably affecting the nickel chromium.

2. The method of claim 1, wherein:
the conductor is gold.

3. The method of claim 2, wherein:
the diffusion barrier comprises tungsten titanium alloy.

4. An etchant for removing tungsten and tungsten titanium alloy from a composite structure including a layer of nickel chromium without adversely affecting the nickel or chromium, comprising a solution of:

| cupric sulfate (CUSO$_4$) | 5 grams |
| ammonium hydroxide (NH$_4$OH) | 10 milliliters |
| glycerol | 100 milliliters |
| deionized water | 125 milliliters. |

5. A method of fabricating a precision thin film resistor comprising the steps of:
   establishing a thin film layer of approximately 250-300 Å thickness of nickel chromium alloy on an insulator surface of a support;
   forming a diffusion barrier for said layer comprising at least a layer of tungsten having a thickness of approximately 500 Å-1000 Å overlaying said thin film layer;
   establishing a conductor layer over said diffusion barrier having a thickness of approximately 2000 Å or more;
   heating the thin film layer, diffusion barrier and conductor layer to a temperature less than 300° C. to stabilize the resistor value;
   employing photographic masking and etching techniques to pattern the layers to form said resistor; and
   utilizing a solution of:

| cupric sulfate (CUSO$_4$) | 5 grams |
| ammonium hydroxide (NH$_4$OH) | 10 milliliters |
| glycerol | 100 milliliters |
| deionized water | 125 milliliters | to remove the undesired tungsten without appreciably affecting the nickel chromium.

6. The method of claim 5 wherein:
tungsten titanium alloy is substituted for said at least a layer of tungsten.

* * * * *